(12) United States Patent
Schlenker et al.

(10) Patent No.: US 9,502,682 B2
(45) Date of Patent: Nov. 22, 2016

(54) OPTOELECTRONIC DEVICE

(71) Applicant: OSRAM OLED GmbH, Regensburg (DE)

(72) Inventors: Tilman Schlenker, Nittendorf (DE); Andrew Ingle, Allershausen (DE); Marc Philippens, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 14/443,061

(22) PCT Filed: Nov. 13, 2013

(86) PCT No.: PCT/EP2013/073728
§ 371 (c)(1),
(2) Date: May 14, 2015

(87) PCT Pub. No.: WO2014/076132
PCT Pub. Date: May 22, 2014

(65) Prior Publication Data
US 2015/0295204 A1     Oct. 15, 2015

(30) Foreign Application Priority Data
Nov. 14, 2012   (DE) .................. 10 2012 220 724

(51) Int. Cl.
*H01L 51/52* (2006.01)

(52) U.S. Cl.
CPC ......... *H01L 51/5253* (2013.01); *H01L 51/529* (2013.01); *H01L 51/5209* (2013.01); *H01L 51/5225* (2013.01); *H01L 51/5243* (2013.01); *H01L 51/5203* (2013.01); *H01L 2251/5361* (2013.01); *H01L 2251/558* (2013.01)

(58) Field of Classification Search
CPC ........... H01L 51/5253; H01L 51/5225; H01L 51/5243; H01L 51/5209; H01L 51/529; H01L 2251/558; H01L 2251/5361; H01L 51/5203
See application file for complete search history.

(56) References Cited

U.S. PATENT DOCUMENTS

| | | | |
|---|---|---|---|
| 6,515,417 B1 | 2/2003 | Duggal et al. | |
| 2008/0054795 A1* | 3/2008 | Ohmi ................. | H01L 51/5206 313/504 |
| 2008/0211402 A1 | 9/2008 | DeCook et al. | |

FOREIGN PATENT DOCUMENTS

| | | |
|---|---|---|
| CN | 101027941 A | 8/2007 |
| DE | 102011005612 A1 | 9/2012 |
| EP | 2011639 A1 | 1/2009 |
| WO | 2006/003133 A1 | 1/2006 |
| WO | 2006/117717 A2 | 11/2006 |
| WO | 2007/013001 A2 | 2/2007 |
| WO | 2010/125494 A1 | 11/2010 |
| WO | 2011/108921 A1 | 9/2011 |

* cited by examiner

*Primary Examiner* — Kyoung Lee
(74) *Attorney, Agent, or Firm* — McDermott Will & Emery LLP

(57) ABSTRACT

An optoelectronic device is provided which comprises a functional layer stack (6), an encapsulation layer (7) provided for encapsulating the layer stack, and at least one metal layer (8), wherein the functional layer stack comprises at least one organic active layer (63), which emits electromagnetic radiation when the device is in operation, the encapsulation layer completely covers the at least one organic active layer when viewed in plan view onto the layer stack, and the metal layer is arranged on a side of the encapsulation layer remote from the layer stack.

20 Claims, 2 Drawing Sheets

OPTOELECTRONIC DEVICE

Figure 1:
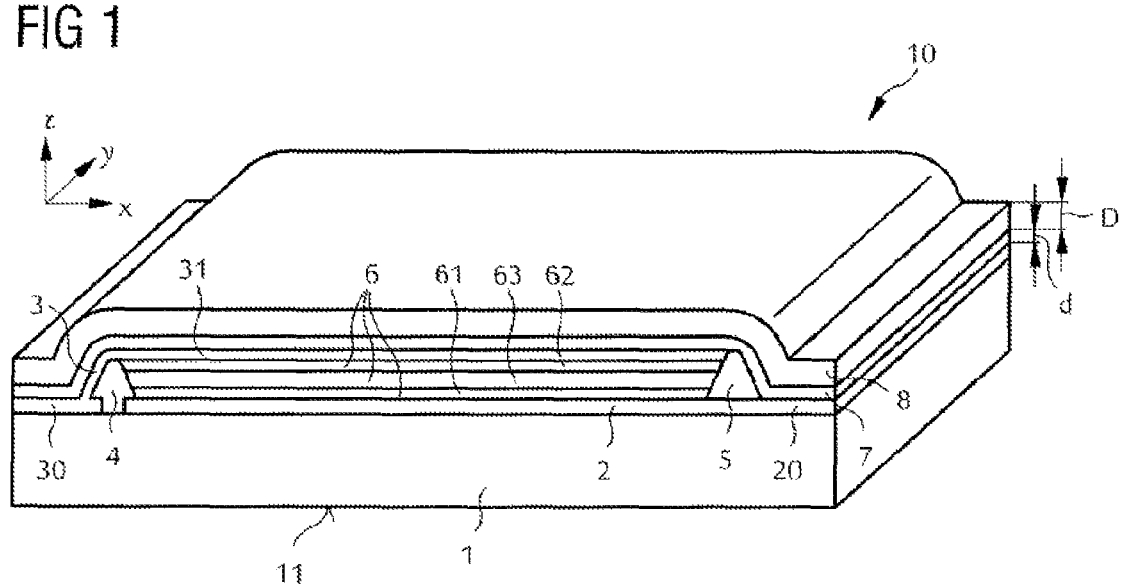

The present application relates to an optoelectronic device.

Organic light-emitting diodes (OLEDs) are operated at high power over a large area for illumination purposes. In the process, the OLEDs warm up more within the surface than at the edge. This results in uneven ageing of the OLEDs, which leads to non-homogeneous luminance. In addition, the high currents in the thin conductor tracks of the OLEDs, which are frequently applied using a lithographic method, lead to voltage drops. This likewise leads to non-homogeneous luminance. A conventional OLED is frequently provided with a glass sheet on each of its two sides. Glass generally has poor thermal conductivity, such that heat arising during operation of the OLED cannot be efficiently dissipated out of the OLED.

An object is to provide an optoelectronic device which comprises efficient heat dissipation and homogeneous luminance.

This object is achieved by an optoelectronic device according to the independent claim. Further configurations and further developments constitute the subject matter of the dependent claims.

According to one embodiment, an optoelectronic device comprises at least one functional layer stack, one encapsulation layer provided for encapsulating the layer stack, and at least one metal layer. The functional layer stack preferably comprises at least one organic active layer, which emits electromagnetic radiation when the device is in operation. The encapsulation layer preferably completely covers the at least one organic active layer when viewed in plan view onto the layer stack. The metal layer is arranged on a side of the encapsulation layer remote from the layer stack.

An encapsulation layer is here and hereinafter understood to be a layer or a plurality of layers which encapsulates the layer stack of the device and protects it from environmental influences such as atmospheric humidity or oxygen. Preferably the encapsulation layer is configured such that no atmospheric humidity and no substances in gaseous state can pass through the encapsulation layer.

According to one configuration, the functional layer stack comprises for example a plurality of layers with organic polymers, organic oligomers, organic monomers, organic small, non-polymeric molecules or combinations thereof. In particular, it may be advantageous for the organic functional layer stack to comprise an organic functional layer which takes the form of a hole transport layer in order to ensure effective hole injection into the at least one organic active layer. Materials which may prove advantageous for the hole transport layer are for example tertiary amines, carbazole derivatives, conductive polyaniline or polyethylene dioxythiophene. Materials suitable as materials for the at least one organic active layer are materials which have radiation emission based on fluorescence or phosphorescence, for example polyfluorene, polythiophene or polyphenylene, or derivatives, compounds, mixtures or copolymers thereof. Furthermore, the organic functional layer stack may comprise a functional layer which takes the form of an electron-transport layer. Furthermore, the functional layer stack may also comprise a plurality of organic active layers, wherein the active layers are arranged between the hole transport layer and the electron-transport layer and emit electromagnetic radiation when the device is in operation.

According to one configuration, the metal layer is arranged on the encapsulation layer. In particular, the metal layer adjoins the encapsulation layer. This has the advantage that the heat generated when the device is in operation can be dissipated via the encapsulation layer directly into the metal layer and out of the element into the surrounding environment. In plan view onto the active layer, the metal layer covers the encapsulation layer, in particular to a major extent. For example, the metal layer covers at least 75%, in particular at least 85%, of the outer face of the encapsulation layer remote from the layer stack. For example, it is possible for the metal layer to cover the encapsulation layer completely. The metal layer conveniently contains a metal, which is for example copper, silver or aluminium. Such a metal layer is easily applicable to the encapsulation layer and is distinguished by good thermal conductivity.

According to one configuration, the device comprises a carrier body. The functional layer stack is arranged on the carrier body. The carrier body comprises a radiation exit face of the device in particular on a side remote from the layer stack. The carrier body preferably contains glass or consists of glass. In this respect, the carrier body is configured to be transmissive for electromagnetic radiation generated when the device is in operation. The carrier body may be clear, transparent or milky opaque.

According to one configuration, the device comprises a first electrode and a second electrode. The electrodes serve in electrical contacting of the layer stack. The layer stack is for example arranged at least in places between the first electrode and the second electrode. In particular, the first electrode is applied directly onto the carrier body. The first electrode is conveniently of radiation-transmissive construction. For example, the first electrode has a transmittance for the radiation generated by the active layer of at least 70%, preferably at least 80%, particularly preferably at least 90%. Particularly preferably, the first electrode contains at least one transparent conductive oxide (TCO).

According to one configuration, the first electrode comprises a first contact track and the second electrode a second contact track. For example, the first contact track and the second contact track are arranged directly on the carrier body. This means that the first contact track and the second contact track then each have a common boundary surface with the carrier body. The first contact track and the second contact track are for example spaced laterally from one another. A lateral direction is understood to mean a direction which is directed parallel to a main plane of extension of the organic active layer. On the carrier body the first contact track and the second contact track each extend for example in a direction which runs parallel to one edge of the carrier body.

According to one variant configuration, the first contact track and the second contact track are arranged in such a way on the carrier body that they do not overlap with the organic active layer at all when viewed in plan view onto the encapsulation layer. In other words, the contact tracks run sideways of the active layer. A sub-region of the second electrode may then extend from the second contact track above and/or below the active layer. This sub-region may be formed with the same material as or a different material from the second contact track. In particular, a sub-region of the first electrode which adjoins the first contact track may extend directly below the active layer. This sub-region of the first electrode may be formed with the same material as or a different material from the first contact track or the second electrode.

According to one configuration, the metal layer is preferably connected with the first electrode. In particular, the metal layer is in direct mechanical and electrical contact with the first contact track of the first electrode. In other words, the first metal layer and the first contact track have a common boundary surface. The metal layer thus also serves in power supply in addition to dissipating heat from the device. This leads to a clear reduction in voltage drops along the first contact track, whereby homogeneous luminance is achieved at least along the first contact track. Furthermore, the first electrode may be made as thin as possible, whereby the transmission of the first electrode may be increased for the radiation generated when the device is in operation.

According to one configuration, the metal layer comprises a first sub-region and a second sub-region. For example, the first sub-region and the second sub-region are separated laterally from one another by a separating trench, such that there is no direct mechanical or electrical contact between the sub-regions of the metal layer. Preferably, the first sub-region of the metal layer is connected electrically with the first electrode. The second sub-region of the metal layer is preferably connected electrically with the second electrode. For example, the first sub-region and the second sub-region are in direct mechanical and electrical contact with the first contact track and the second contact track respectively. In other words, the first sub-region and the first contact track comprise a common first boundary surface. The second sub-region and the second contact track comprise a second common boundary surface. This leads to a reduction in voltage drops along the first contact track and along the second contact track, such that homogeneous luminance is achieved for the device.

According to one configuration, the device is of surface-mountable construction. Preferably, electrical contacting of the device then takes place at a backside, i.e. via the first sub-region and via the second sub-region of the metal layer. In other words, the device may for example be mounted on a printed circuit board with electrical conductor tracks such that the sub-regions of the metal layer are in direct mechanical and electrical contact with the conductor tracks of the printed circuit board. An outer surface of the metal layer remote from the encapsulation layer for example forms a mounting surface of the device. Such a device is easily mountable and may be easily electrically contacted. Heat generated when in operation is removed via the metal layer to the printed circuit board.

According to one configuration, the device comprises a first insulating structure. Furthermore, the device for example comprises a second insulating structure. In particular, the first insulating structure and the second insulating structure are spaced laterally from one another. In the lateral direction the first electrode and the second electrode are separated from one another for example by means of the first insulating structure. In particular, the first insulating structure separates the second contact track of the second electrode from the first electrode. Preferably, the layer stack extends between the first insulating structure and the second insulating structure. In particular, the layer stack is defined in the lateral direction on both sides by the insulating structures, so simplifying the process of applying of the layer stack.

According to one configuration, the metal layer has a thickness in the vertical direction. A vertical direction is understood to mean a direction which is directed perpendicular to a main plane of extension of the organic active layer. The vertical direction and the lateral direction are thus perpendicular to one another. The thickness of the metal layer is preferably at least twice as great as the thickness of the encapsulation layer. For example, the metal layer is at least ten times, preferably a hundred times, as thick as the encapsulation layer. More preferably, the thickness of the metal layer is at least twice as great as the thickness of the first electrode and/or the second electrode. For example, the metal layer is at least ten times, preferably a hundred times as thick as the first electrode and/or the second electrode.

According to one configuration, the thickness of the encapsulation layer is preferably less than 10 μm, for example less than 5 μm, and in particular less than or equal to 1 μm. A maximally thin encapsulation layer improves heat dissipation from the layer stack into the metal layer. According to one variant configuration, the encapsulation layer takes the form of a thin-film encapsulation. "Thin-film encapsulation" is understood for the purposes of the application to mean an encapsulation arrangement which is suitable for forming a barrier relative to atmospheric substances, in particular relative to moisture and oxygen. Preferably, the thin-film encapsulation contains a plurality of thin inorganic layers, wherein the barrier effect is produced by the thin layers. Preferably, such an inorganic layer has a thickness less than or equal to a few 100 nm, for example 200 nm. Preferably, the thin-film encapsulation has a total thickness in the vertical direction which is less than or equal to 1 μm.

According to one configuration, the thickness of the metal layer is for example between 1 μm and 5 mm inclusive. Preferably, the thickness of the metal layer amounts to between 0.5 mm and 3 mm inclusive. The metal layer is thus not only particularly well suited to heat dissipation, but may also be used as mechanical protection for the layer stack. In this way, in contrast to conventional devices, it is possible to dispense with a body which is arranged for protection on a side of the encapsulation layer remote from the active layer and normally contains glass or consists of glass. The heat generated when the device is in operation may thus be removed via the metal layer directly into the surrounding environment, such that heat dissipation out of the device is particularly efficiently configured.

Figure 2:
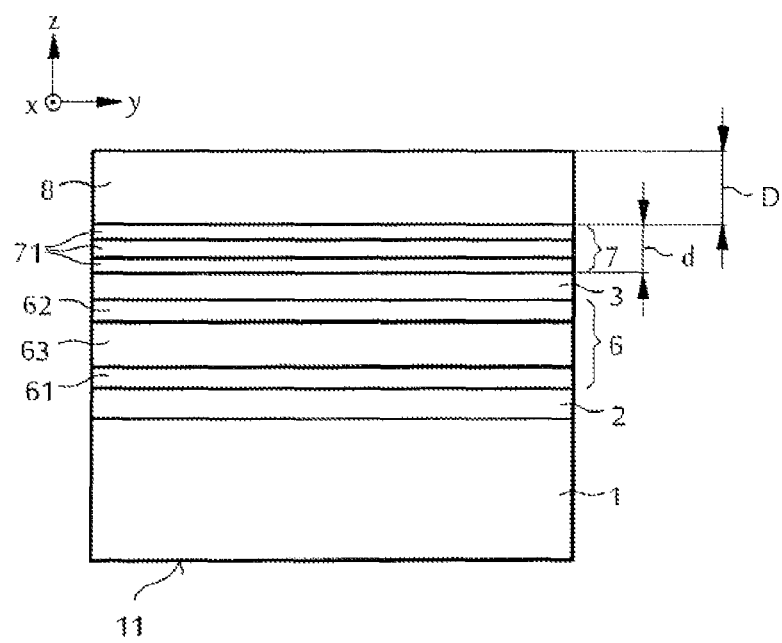
Figure 3:
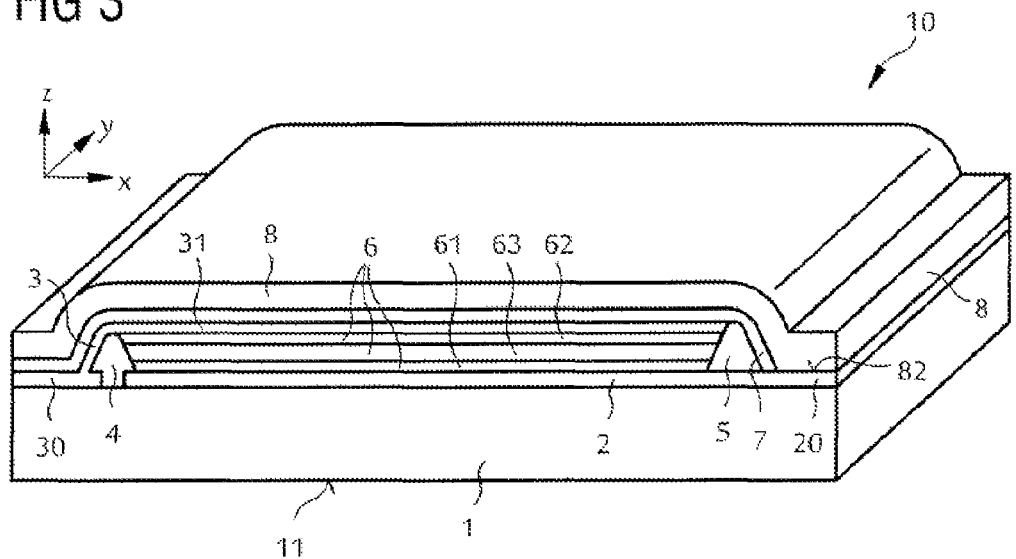
Figure 4:
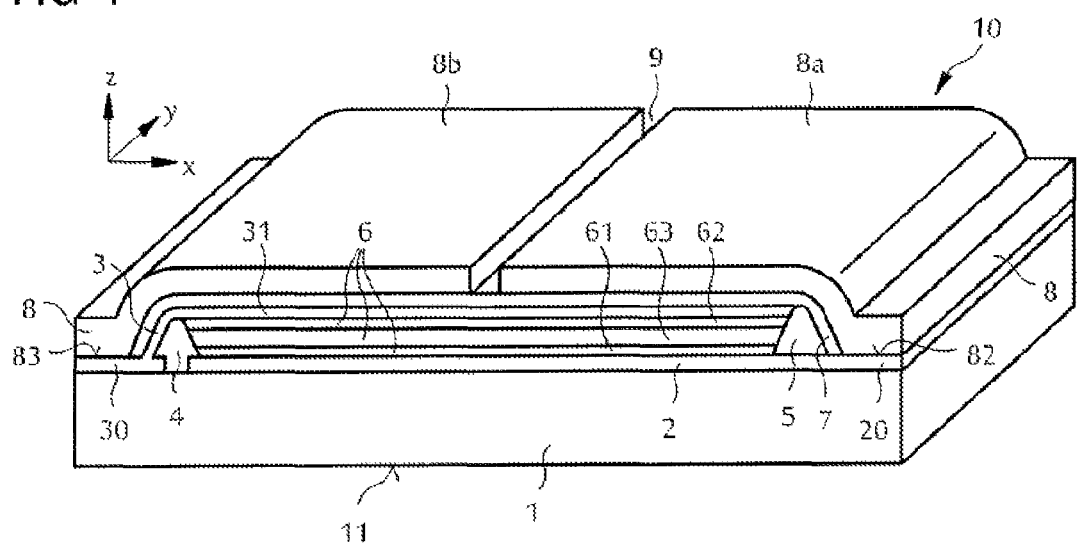

Further advantages, preferred configurations and further developments of the optoelectronic device are revealed by the exemplary embodiments explained hereinafter in conjunction with FIGS. 1 to 4, in which:

FIG. 1 is a schematic representation of an exemplary embodiment of an optoelectronic device, FIG. 2 is a schematic sectional view of a further exemplary embodiment of an optoelectronic device, FIG. 3 is a schematic representation of a further exemplary embodiment of an optoelectronic device, and FIG. 4 is a schematic representation of a further exemplary embodiment of an optoelectronic device.

Identical, similar or identically acting elements are provided with identical reference numerals in the figures. The figures are in each case schematic representations and are therefore not necessarily true to scale. Rather, comparatively small elements and in particular layer thicknesses may be illustrated on an exaggeratedly large scale for clarification.

A first exemplary embodiment of an optoelectronic device is illustrated schematically in FIG. 1.

The optoelectronic device 10 comprises a carrier body 1, a functional layer stack 6 arranged on the carrier body, an encapsulation layer 7 and a metal layer 8. In the vertical direction Z the layer stack 6 is arranged between the carrier body and the encapsulation layer. The metal layer 8 is in particular arranged directly on a side of the encapsulation layer 7 remote from the layer stack 6. In plan view onto the carrier body, the metal layer completely covers the encapsulation layer 7.

The functional layer stack 6 comprises an organic active layer 63. When the device is in operation the active layer emits electromagnetic radiation, for example in the ultraviolet, visible or infrared spectral range. The layer stack 6 additionally contains a first charge transport layer 61 and a second charge transport layer 62, wherein the organic active layer 63 is arranged between the first charge transport layer 61 and the second charge transport layer 62. The first and second charge transport layers may take the form of an electron transport layer and a hole transport layer respectively. These charge transport layers serve to inject the holes and electrons into the organic active layer 63. Furthermore, the layer stack 6 may also comprise electron and/or hole blocking layers, which are not shown in FIG. 1.

The carrier body 1 is of radiation-transmissive construction. The carrier body may contain glass or consists of glass. The carrier body comprises a radiation exit face 11 of the device 10 on a side remote from the layer stack 6. This means that the radiation generated when the device is in operation leaves the device at the radiation exit face 11. The radiation exit face 11 is of planar configuration. In other words, the radiation exit face does not comprise any curvature, within the bounds of manufacturing tolerances. It is conceivable, however, that the radiation exit face 11 comprises a roughened structure, such that outcoupling efficiency is improved and the radiation generated by the device is evenly distributed in all emission directions.

The device 10 further comprises a first electrode 2 and a second electrode 3 for electrical contacting of the layer stack 6. The first electrode is of radiation-transmissive construction. The first electrode may contain transparent conductive materials, which are for example transparent conductive oxides. Transparent conductive oxides are normally metal oxides, such as for example zinc oxide, tin oxide, cadmium oxide, titanium oxide, indium oxide or indium-tin oxide (ITO). In addition to binary metal-oxygen compounds, such as for example ZnO, SnO2 or In2O3, the group of TCOs also includes ternary metal-oxygen compounds, such as for example Zn2SnO4, CdSnO3, ZnSnO3, MgIn2O4, GaInO3, Zn2In2O5 or In4Sn3O12 or mixtures of different transparent conductive oxides. Furthermore, TCOs do not necessarily correspond to a stoichiometric composition and may also be p- or n-doped.

The first electrode includes a first contact track 20, wherein the contact track is arranged to the side of the layer stack in a lateral direction. The second electrode 3 comprises a second contact track 30, wherein the second contact track is arranged likewise to the side of the layer stack in the lateral direction. The first contact track 20 and the second contact track 30 are spaced laterally. Furthermore, the first contact track 20 and the second contact track 30 are arranged directly on the carrier body 1 of the device. In plan view onto the carrier body, the layer stack 6 is located between the first contact track and second contact track. In particular, the first contact track 20 and the second contact track 30 do not overlap with the organic active layer 63.

The second contact track 30 and the entire first electrode 2 may be applied flat to the carrier body 1 using a lithographic method. Between the first electrode 2 and the second contact track 30 a first insulating structure 4 is formed, whereby the second contact track 30 and the first electrode are separated laterally from one another. The second electrode 3 extends in places in the vertical direction Z and completely covers the first insulating structure 4. The second electrode 3 additionally comprises a sub-region 31 which is spaced in the vertical direction Z from the first electrode 2. The further sub-region 31 adjoins the layer stack 6. In plan view onto the carrier body 1, the sub-region 31 of the second electrode 3 completely covers the layer stack 6. The sub-region 31 of the second electrode may be formed with the same material as or a different material from the second contact track 30.

In addition to the first insulating structure 4, the device 10 comprises a second insulating structure 5. The insulating structures extend in a lateral longitudinal direction Y and are spaced in a lateral transverse direction X. In the lateral longitudinal direction Y the insulating structures extend for example parallel to one another. The first insulating structure 4 is arranged directly on the carrier body 1. The second insulating structure 5 is arranged directly on the first electrode 2. The layer stack 6 extends in the lateral transverse direction X between the first insulating structure and the second insulating structure 5. In other words, the layer stack 6 is defined between the first insulating structure 4 and the second insulating structure 5. In plan view onto the carrier body 1, the layer stack 6 does not exhibit any overlap with the second contact track 30 of the second electrode 3. Owing to the arrangement between the insulating structures 4 and 5, the process of applying of the functional layer stack 6 may be simplified.

The insulating structures 4 and 5 contain for example at least one lacquer. In particular, the lacquer is photopatternable. The lacquer in particular comprises an organic material. The insulating structures may be formed after the process of applying of a lacquer layer for example using a photolithographic method. Alternatively, the insulating structures 4 and 5 may also be produced by a screen printing lacquer or a spray lacquer. The screen printing lacquer or the spray lacquer may in particular contain organic and/or inorganic fillers.

It is also feasible for the insulating structures 4 and 5 to contain at least one inorganic material such as silicon oxide, silicon nitride or aluminium oxide or to consist of such a material. The insulating structures may for example be produced by plasma deposition, vapour deposition or sputtering. For example, the insulating structures are applied during production using shadow masks. Alternatively, the insulating structures may firstly be applied flat and then patterned.

In plan view onto the carrier body 1, the encapsulation layer 7 completely covers the first insulating structure 4, the second insulating structure 5 and the layer stack 6. Furthermore, the encapsulation layer 7 may completely surround the functional layer stack 6 in the lateral direction, such that the layer stack 6 is hermetically sealed from the encapsulation layer and from the electrodes or from the carrier body. Air-tight encapsulation of the layer stack 6 protects the sensitive layers of the layer stack from external environmental influences, for example from atmospheric humidity or oxygen.

In FIG. 1 the metal layer 8 is arranged directly on the encapsulation layer 7. In plan view onto the carrier body, the metal layer completely covers the encapsulation layer. Such an arrangement increases the efficiency with which heat generated during operation of the device is dissipated out of the device. Materials which may be used for the metal layer 8 are copper, silver, aluminium or other metals.

The metal layer 8 may be applied directly onto the already operable layer stack 6 with the electrodes. For example, the metal layer is applied onto the encapsulation layer 7 as a copper or aluminium paste using a coating method such as vapour deposition, inkjet printing or knife coating. The metal layer 8 is hardened for example by evaporation of a solvent and by annealing at a temperature for example of between 70° C. and 90° C., for example 80° C. Alternatively, to form the metal layer 8 for example first of all metal powder is applied onto the encapsulation layer 7. Then in particular a metal in liquid form may be applied to the metal powder, such that the metal layer 8 is formed from the metal powder and from the liquid metal.

In the vertical direction Z the metal layer 8 has a thickness D which amounts for example to between 1 μm and 5 mm inclusive. The metal layer 8 may be configured such that it serves to protect the encapsulation layer 7 and the layer stack 6 from external mechanical influences. In particular, the thickness D of the metal layer amounts to between 0.5 mm and 3 mm inclusive, for example 1 mm. Such a thick metal layer 8 provides the device 10 with sufficient protection from external mechanical influences, such that on a back of the device, i.e. on a side of the encapsulation layer 7 remote from the active layer 63, it is possible to dispense with an additional body, as used in conventional devices, which contains glass or consists of glass. In other words, the optoelectronic device 10 merely comprises a carrier body 1, which contains glass or consists of glass and on a front of the device, i.e. on a side of the carrier body remote from the active layer 63, comprises the radiation exit face 11 of the device.

In the vertical direction Z the encapsulation layer 7 has a thickness d. In particular, the thickness D of the metal layer 8 is at least twice as great as the thickness d of the encapsulation layer. For example, the metal layer 8 is at least ten times, in particular a hundred times, as thick as the encapsulation layer 7. Moreover, the thickness of the metal layer 8 is for example at least twice as great as the thickness of the contact track of the first electrode 2 and/or of the second electrode 3. For example, the metal layer is at least ten times, in particular a hundred times, as thick as the first contact track and/or the second contact track. In particular, the first contact track 20 comprises a thickness of equal magnitude to a sub-region of the first electrode 2 which extends directly below the active layer 63 on the main body 1. For example, the thickness of the first contact track is less than or equal to 1 μm. In particular, the thickness of the first contact track amounts to between 300 nm and 800 nm.

The thickness d of the encapsulation layer 7 amounts for example to between 100 nm and 10 μm inclusive. In particular, the thickness of the encapsulation layer is less than 1 μm. Such a thin encapsulation layer 7 promotes the dissipation of heat from the layer stack 6 into the metal layer 8. A metal is generally sufficiently thermally conductive for the heat to be distributed evenly over the entire device. In this way, uneven ageing of the OLED over the surface and at the edge of the device may be avoided. The metal layer may moreover for example be applied flat and markedly more thickly than the lithographic first electrode 2 and second electrode 3. Thus, the heat is primarily dissipated via a backside of the device, whereby an ageing process on the front of the device, in particular discoloration of the radiation exit face, is advantageously retarded.

FIG. 2 is a schematic representation of an exemplary embodiment of an optoelectronic device in a section plane in a lateral longitudinal direction.

This exemplary embodiment is substantially in accordance with the exemplary embodiment in FIG. 1. In contrast thereto, the encapsulation layer 7 comprises a plurality of layers 71. The layers 71 may contain inorganic materials or consist of inorganic materials. The encapsulation layer 7 may take the form of a thin-film encapsulation, wherein the thin-film encapsulation comprises layers which generally have a thickness of less than or equal to a few 100 nm, for example 200 nm. In particular, the encapsulation layer 7 may contain at least one layer 71, which is deposited using atomic layer deposition, wherein the at least one layer 71 has a thickness of between one atomic layer and 20 nm inclusive. The thin-film encapsulation 7 for example has a total thickness of between 100 nm and 10 μm inclusive. In particular, the thin-film encapsulation may have a total thickness which is less than or equal to 1 μm.

FIG. 3 is a schematic representation of a further exemplary embodiment of an optoelectronic device.

This exemplary embodiment is substantially in accordance with the exemplary embodiment in FIG. 1. In contrast thereto, the encapsulation layer 7 only partially covers the first electrode 2 when viewed in plan view onto the carrier body 1. In particular, the metal layer 8 is connected electrically to the first electrode 2 via the first contact track 20. The metal layer 8 is in direct mechanical and electrical contact with the first contact track 20. In other words, the metal layer 8 and the first contact track 20 comprise a common boundary surface 82. The common boundary surface 82 extends in the lateral longitudinal direction Y. In addition to heat dissipation, the metal layer 8 thus also serves in power supply in the lateral longitudinal direction Y, so reducing voltage drops in the first electrode, in particular along the first contact track 20. This makes the luminance of the device homogeneous. In addition, the first radiation-transmissive electrode 2 may be constructed to be as thin as possible, so increasing the transmittance of the first electrode 2.

The encapsulation layer 7 is for example initially applied over the entire surface of the carrier body 1, such that the encapsulation layer 7 completely covers the first electrode 2 and the second electrode 3. Prior to the process of applying of the metal layer 8 onto the encapsulation layer 7, the encapsulation layer 7 is for example removed in such a way that the first contact track 20 is at least partly exposed. So that an electrical connection is established between the metal layer 8 and the first electrode 2, the metal layer 8 may then be applied flat onto the encapsulation layer 7 and onto the first electrode 2 in such a way that a direct mechanical and electrical contact arises between the metal layer 8 and the contact track 20.

FIG. 4 is a schematic representation of a further exemplary embodiment of an optoelectronic device. This exemplary embodiment is substantially in accordance with the exemplary embodiment in FIG. 3. In contrast thereto, the metal layer 8 comprises a first sub-region 8a and a second sub-region 8b. The first sub-region 8a is spaced from the second sub-region 8b in the lateral direction. This means that the metal layer 8 comprises a separating trench 9, which separates the first sub-region 8a from the second sub-region 8b. The first sub-region 8a of the metal layer is electrically connected with the first electrode 2 via the first contact track 20. The first sub-region 8a and the first contact track 20 comprise a common boundary surface 82 along the lateral longitudinal direction Y. The second sub-region 8b of the metal layer is connected electrically to the second electrode via the second contact surface 30. The second sub-region 8b of the metal layer and the second contact track 30 comprise a common boundary surface 83 in the lateral longitudinal direction Y. The common boundary surfaces 82 and 83 are each spaced laterally from the organic active layer 63. In other words, the active layer 63, the first common boundary surface 82 and the second common boundary surface 83 do not overlap at all when viewed in plan view onto the carrier body 1. Through such an arrangement of the metal layer 8, uniform current distribution is achieved in the lateral longitudinal direction Y, so achieving homogeneous luminance for the device.

Furthermore, the device 10 may be of surface-mountable construction. For example, the electrical contacting of the device proceeds via a backside of the device, i.e. via the side of the encapsulation layer 7 remote from the active layer 63. In other words, the device is brought into electrical contact with an external voltage source via the first sub-region 8a and the second sub-region 8b. Such a device is easily mountable and may be easily electrically contacted.

The first sub-region 8a and the second sub-region 8b of the metal layer 8 may be produced in one process step. In this respect, a mask is for example arranged on the encapsulation layer 7 and a material for the metal layer is applied through the mask directly onto the encapsulation layer. In the process, the metal layer 8 may be applied to the encapsulation layer 7 by vapour deposition or applied by to the encapsulation layer 7 by flash evaporation for example of aluminium. The flash evaporation method in particular has the advantage that within a short processing time a metal layer of sufficient thickness is produced, which is suitable for heat dissipation and power supply. The separating trench 9 is formed by removal of the mask.

With use of the metal layer on the encapsulation layer, heat arising during operation of the device is effectively dissipated, the heat being distributed uniformly over the entire device. This may increase the service life of the device. At the same time, the metal layer may be used as an additional electrode for uniform current distribution in the device, such that homogeneous luminance of the device may be achieved. Furthermore, the metal layer may serve as mechanical protection for the encapsulation layer and/or for the functional layer stack, such that on a backside of the device it is possible to dispense with a poorly thermally conductive carrier body, which for example contains glass or consists of glass.

The description of the invention made with reference to the exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

This patent application claims priority from German patent application 10 2012 220 724.4, the disclosure content of which is hereby included by reference.

The invention claimed is:

1. An optoelectronic device having a functional layer stack, an encapsulation layer provided for encapsulating the layer stack, a first insulating structure, a second insulating structure and at least one metal layer, wherein
the functional layer stack comprises at least one organic active layer, which emits electromagnetic radiation when the device is in operation,
the encapsulation layer completely covers the at least one organic active layer when viewed in plan view onto the layer stack,
the metal layer is arranged on a side of the encapsulation layer remote from the layer stack,
the second insulating structure is spaced laterally from the first insulating structure, and
the layer stack extends between the first insulating structure and the second insulating structure.

2. The optoelectronic device according to claim 1, wherein
the encapsulation layer is a thin-film encapsulation, wherein the thin-film encapsulation has a thickness which is less than or equal to 1 μm,
the metal layer has a thickness which is at least twice as great as the thickness of the encapsulation layer,
the metal layer covers at least 75% of an outer surface of the encapsulation layer remote from the layer stack.

3. The optoelectronic device according to claim 1, wherein the metal layer has a thickness which is between 0.5 millimeters and 3 millimeters inclusive.

4. The optoelectronic device according to claim 1, wherein the metal layer is arranged directly on the encapsulation layer.

5. The optoelectronic device according to claim 1, comprising a carrier body, wherein
the functional layer stack is arranged on the carrier body; and
the carrier body comprises a radiation exit face of the device on a side remote from the layer stack.

6. The optoelectronic device according to claim 5, comprising a first electrode and a second electrode for electrical contacting of the layer stack, wherein the layer stack is arranged at least in places between the first electrode and second electrode.

7. The optoelectronic device according to claim 6, wherein the first electrode comprises a first contact track and the second electrode comprises a second contact track, wherein the first contact track and the second contact track are arranged on the carrier body of the device and spaced laterally from one another.

8. The optoelectronic device according to claim 7, wherein the first contact track and the second contact track are arranged directly on the carrier body of the device and do not overlap with the organic active layer at all when viewed in plan view onto the encapsulation layer.

9. The optoelectronic device according to claim 8, wherein the metal layer comprises a first sub-region and a second sub-region, wherein the first sub-region is electrically connected with the first electrode via the first contact track and the second sub-region is electrically connected with the second electrode via the second contact track.

10. The optoelectronic device according to claim 6, wherein the metal layer is electrically connected with the first electrode.

11. The optoelectronic device according to claim 6, wherein the metal layer comprises a first sub-region and a second sub-region spaced laterally from the first sub-region, wherein
the first sub-region of the metal layer is electrically connected with the first electrode; and
the second sub-region of the metal layer is electrically connected with the second electrode.

12. The optoelectronic device according to claim 11, wherein the device is of surface-mountable construction and electrical contacting of the device proceeds at a backside via the first sub-region and via the second sub-region.

13. The optoelectronic device according to claim 1, wherein the metal layer has a thickness which is at least twice as great as the thickness of the encapsulation layer.

14. The optoelectronic device according to claim 1, wherein the encapsulation layer is a thin-film encapsulation, wherein the thin-film encapsulation contains a plurality of inorganic layers.

15. The optoelectronic device according to claim 14, wherein the thin-film encapsulation has a thickness which is less than or equal to 1 micrometer.

16. The optoelectronic device according to claim 1, wherein on a side of the encapsulation layer remote from the active layer the device is free of a body which contains glass or consists of glass.

17. An optoelectronic device having a radiation-transmissive carrier body, a functional layer stack, a radiation-transmissive first electrode arranged between the radiation-transmissive carrier body and the functional layer stack, an encapsulation layer provided for encapsulating the layer stack and at least one metal layer,
wherein
the functional layer stack comprises at least one organic active layer, which emits electromagnetic radiation when the device is in operation;
the encapsulation layer completely covers the at least one organic active layer when viewed in plan view onto the layer stack;
the metal layer has a thickness of between 0.5 mm and 3 mm inclusive, and
the metal layer is arranged on a side of the encapsulation layer remote from the layer stack, wherein the metal layer is electrically connected to the radiation-transmissive first electrode and in plan view onto the carrier body, the metal layer completely covers the encapsulation layer.

18. The optoelectronic device according to claim 17, wherein
the encapsulation layer is a thin-film encapsulation comprising a plurality of inorganic layers and having a thickness which is less than or equal to 1 μm, and
on a side of the thin-film encapsulation remote from the active layer the device is free of a body which contains glass or consists of glass.

19. The optoelectronic device according to claim 17, comprising a first insulating structure and a second insulating structure spaced laterally from the first insulating structure, wherein the layer stack extends between the first insulating structure and the second insulating structure.

20. An optoelectronic device having a functional layer stack, a first electrode and a second electrode for electrical contacting of the layer stack, an encapsulation layer provided for encapsulating the layer stack, a carrier body and at least one metal layer, wherein
the functional layer stack comprises at least one organic active layer, which emits electromagnetic radiation when the device is in operation,
the encapsulation layer completely covers the at least one organic active layer when viewed in plan view onto the layer stack,
the metal layer is arranged on a side of the encapsulation layer remote from the layer stack,
the functional layer stack is arranged on the carrier body,
the carrier body comprises a radiation exit face of the device on a side remote from the layer stack,
the layer stack is arranged at least in places between the first electrode and second electrode, and
the optoelectronic device further comprises one additional feature of the group consisting of additional features i and ii, namely:
i. the metal layer is electrically connected with the first electrode, and
ii. the first electrode comprises a first contact track and the second electrode comprises a second contact track, wherein the first contact track and the second contact track are arranged on the carrier body of the device and spaced laterally from one another.

\* \* \* \* \*